US011129266B2

(12) United States Patent
Van Voorst

(10) Patent No.: US 11,129,266 B2
(45) Date of Patent: Sep. 21, 2021

(54) OPTICAL SYSTEM, METROLOGY APPARATUS AND ASSOCIATED METHOD

(71) Applicant: ASML Netherlands B.V., Veldhoven (NL)

(72) Inventor: Peter Danny Van Voorst, Nijmegen (NL)

(73) Assignee: ASML Netherlands B.V., Veldhoven (NL)

( * ) Notice: Subject to any disclaimer, the term of this patent is extended or adjusted under 35 U.S.C. 154(b) by 80 days.

(21) Appl. No.: 16/566,133

(22) Filed: Sep. 10, 2019

(65) Prior Publication Data

US 2020/0100350 A1      Mar. 26, 2020

(30) Foreign Application Priority Data

Sep. 20, 2018   (EP) ..................................... 18195638

(51) Int. Cl.
*H05G 2/00*      (2006.01)
*G03F 7/20*      (2006.01)

(52) U.S. Cl.
CPC ......... *H05G 2/008* (2013.01); *G03F 7/70925* (2013.01); *H05G 2/005* (2013.01)

(58) Field of Classification Search
CPC ............. G01N 21/9501; G01N 21/956; G01N 23/223; G01N 23/205; G01N 2223/419; G01N 23/046; G01N 21/4788; G01N 23/085; G01N 23/2076; G01N 2223/204; G01N 23/083; G03F 7/70616; G03F 7/70925; H05G 2/005; H05G 2/008; H05G 2/001; H05G 2/006; G21K 1/06;
(Continued)

(56) References Cited

U.S. PATENT DOCUMENTS 6,952,253 B2   10/2005   Lof et al.
7,701,577 B2    4/2010   Straaijer et al.
(Continued)

FOREIGN PATENT DOCUMENTS

EP       1 628 164 A2   2/2006
EP       3 355 315 A1   8/2018
WO    WO 2011/012624 A1   2/2011

OTHER PUBLICATIONS

International Search Report and Written Opinion of the International Searching Authority directed to related International Patent Application No. PCT/EP2019/071830, dated Sep. 17, 2019; 16 pages.

(Continued)

*Primary Examiner* — Irakli Kiknadze
(74) *Attorney, Agent, or Firm* — Sterne, Kessler, Goldstein & Fox P.L.L.C.

(57) ABSTRACT

There is described an optical system (400) for focusing a beam of radiation (B) on a region of interest of a substrate in a metrology apparatus. The beam of radiation comprises radiation in a soft X-ray or Extreme Ultraviolet spectral range. The optical system comprises a first reflector system (410) and a second reflector system (412). Each of the first and second reflector systems (410, 412) comprises a finite-to-finite Wolter reflector system. The optical system (400) is configured to form, on the region of interest, a demagnified image (414) of an object (416) comprising an apparent source of the beam of radiation (B).

20 Claims, 7 Drawing Sheets

(58) Field of Classification Search
CPC .............. G21K 1/062; G21K 2201/067; G21K 2201/061; G21K 2201/065; G21K 1/067; G21K 2201/064; G21K 7/00; H01J 2235/081; H01J 2235/086; H01J 35/08; H01J 35/12; H01J 35/14; H01J 35/147; H01J 35/153; H01J 2235/088; H01J 2235/1204; H01J 35/10; H01J 35/101; H01J 35/105; H01J 35/108; H01J 35/26; H01J 35/30; H01J 35/305; G01J 1/0271; G01B 15/02; G02B 17/04
USPC ........................... 378/62, 119, 136, 138, 145
See application file for complete search history.

(56) References Cited

U.S. PATENT DOCUMENTS

| | | | |
|---|---|---|---|
| 7,791,724 | B2 | 9/2010 | Den Boef et al. |
| 8,115,926 | B2 | 2/2012 | Straaijer |
| 8,553,227 | B2 | 10/2013 | Jordanoska |
| 8,681,312 | B2 | 3/2014 | Straaijer |
| 8,692,994 | B2 | 4/2014 | Straaijer |
| 8,792,096 | B2 | 7/2014 | Straaijer |
| 8,797,554 | B2 | 8/2014 | Straaijer |
| 8,823,922 | B2 | 9/2014 | Den Boef |
| 2007/0069162 | A1* | 3/2007 | Banine ................ G03F 7/70916 250/504 R |
| 2007/0224518 | A1 | 9/2007 | Yokhin et al. |
| 2010/0149548 | A1* | 6/2010 | Shmarev ............ G01B 9/02022 356/517 |
| 2010/0328655 | A1 | 12/2010 | Den Boef |
| 2011/0026032 | A1 | 2/2011 | Den Boef et al. |
| 2011/0102753 | A1 | 5/2011 | Van De Kerkhof et al. |
| 2011/0249244 | A1 | 10/2011 | Leewis et al. |
| 2012/0044470 | A1 | 2/2012 | Smilde et al. |
| 2012/0171600 | A1* | 7/2012 | Catey .................... G03F 7/7065 430/30 |
| 2012/0281197 | A1* | 11/2012 | Tharaldsen ...... G01N 21/95623 355/71 |
| 2013/0108203 | A1* | 5/2013 | Pariza .................. F16C 33/201 384/625 |
| 2013/0162996 | A1 | 6/2013 | Straaijer et al. |
| 2013/0304424 | A1 | 11/2013 | Bakeman et al. |
| 2014/0019097 | A1 | 1/2014 | Bakeman et al. |
| 2015/0194287 | A1 | 7/2015 | Yun et al. |
| 2016/0161863 | A1 | 6/2016 | Den Boef et al. |
| 2016/0178540 | A1* | 6/2016 | Yun ..................... G01N 23/205 378/73 |
| 2016/0282282 | A1 | 9/2016 | Quintanilha et al. |
| 2016/0370717 | A1 | 12/2016 | Den Boef et al. |
| 2017/0184981 | A1 | 6/2017 | Quintanilha et al. |

OTHER PUBLICATIONS

Lemaillet et al., "Intercomparison between optical and x-ray scatterometry measurements of FinFET structures," Metrology, Inspection, and Process Control for Microlithography XXVII, Apr. 8, 2013; 8 pages.

Baez et al., "Formation of Optical Images by X-Rays," Journal of the Optical Society of America, vol. 38, No. 9, Sep. 1948; pp. 766-774.

Matsuyama et al., "Development of a one-dimensional Wolter mirror for achromatic full-field X-ray microscopy," Advances in X-Ray/EUV Optics and Components VI, Proc. of SPIE, vol. 8139, No. 813905, 2011; pp. 1-7.

T.T. Saha, "General surface equations for glancing incidence telescopes," Applied Optics, vol. 26, No. 4, Feb. 15, 1987; pp. 658-663.

Yamada et al., "Simulation of concave-convex imaging mirror system for development of a compact and achromatic full-field x-ray microscope," Applied Optics, vol. 56, No. 4, Feb. 1, 2017; pp. 967-974.

\* cited by examiner

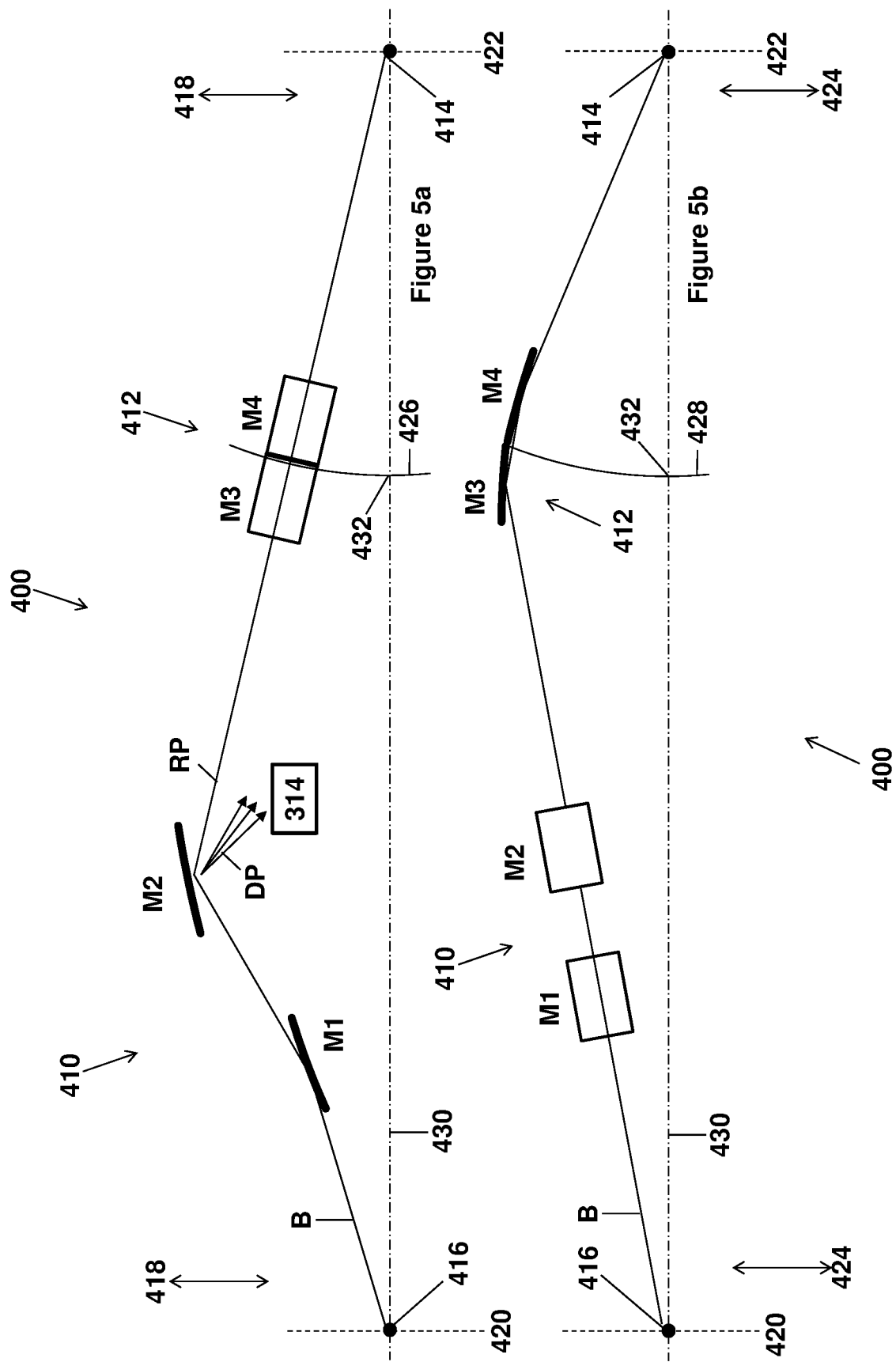

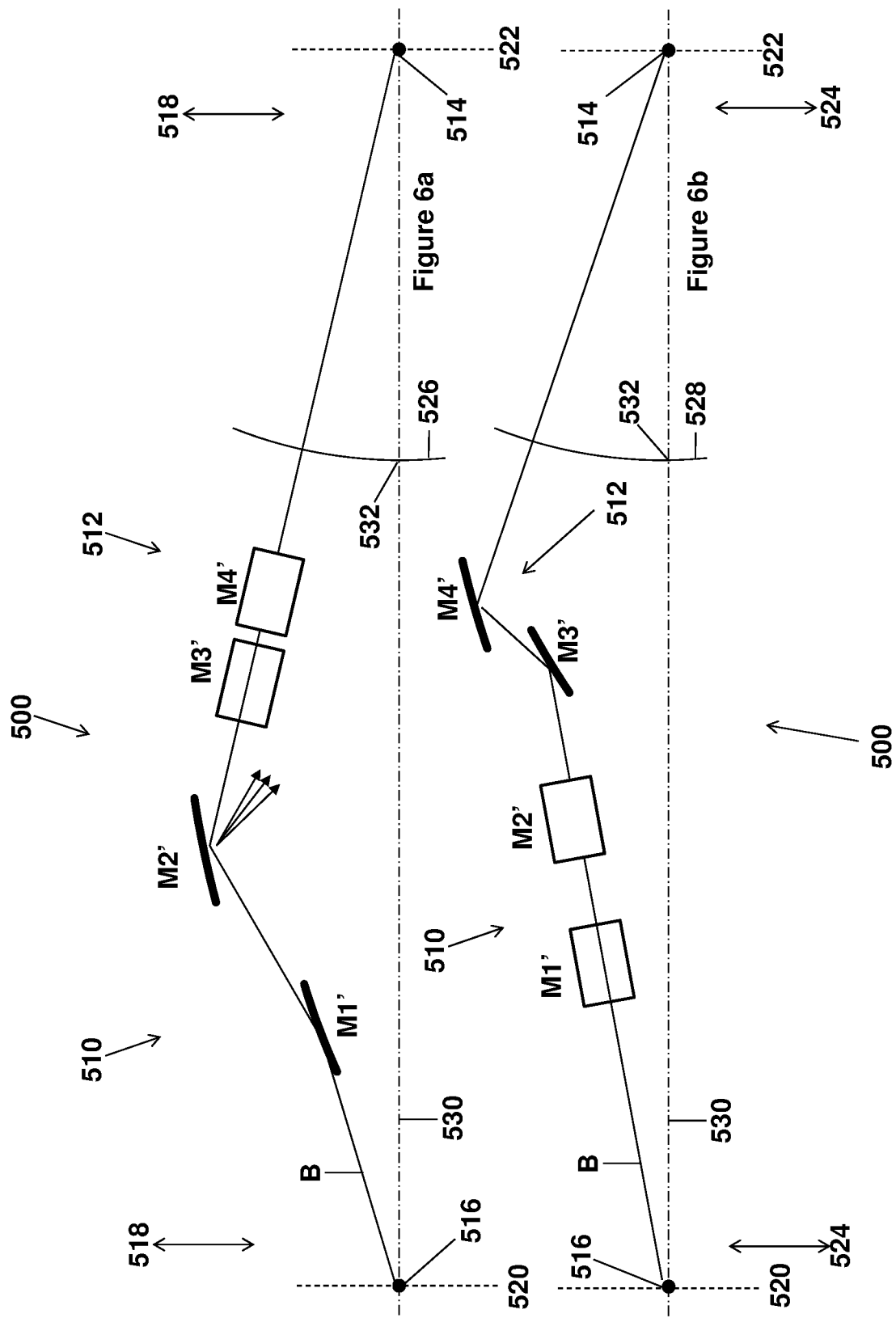

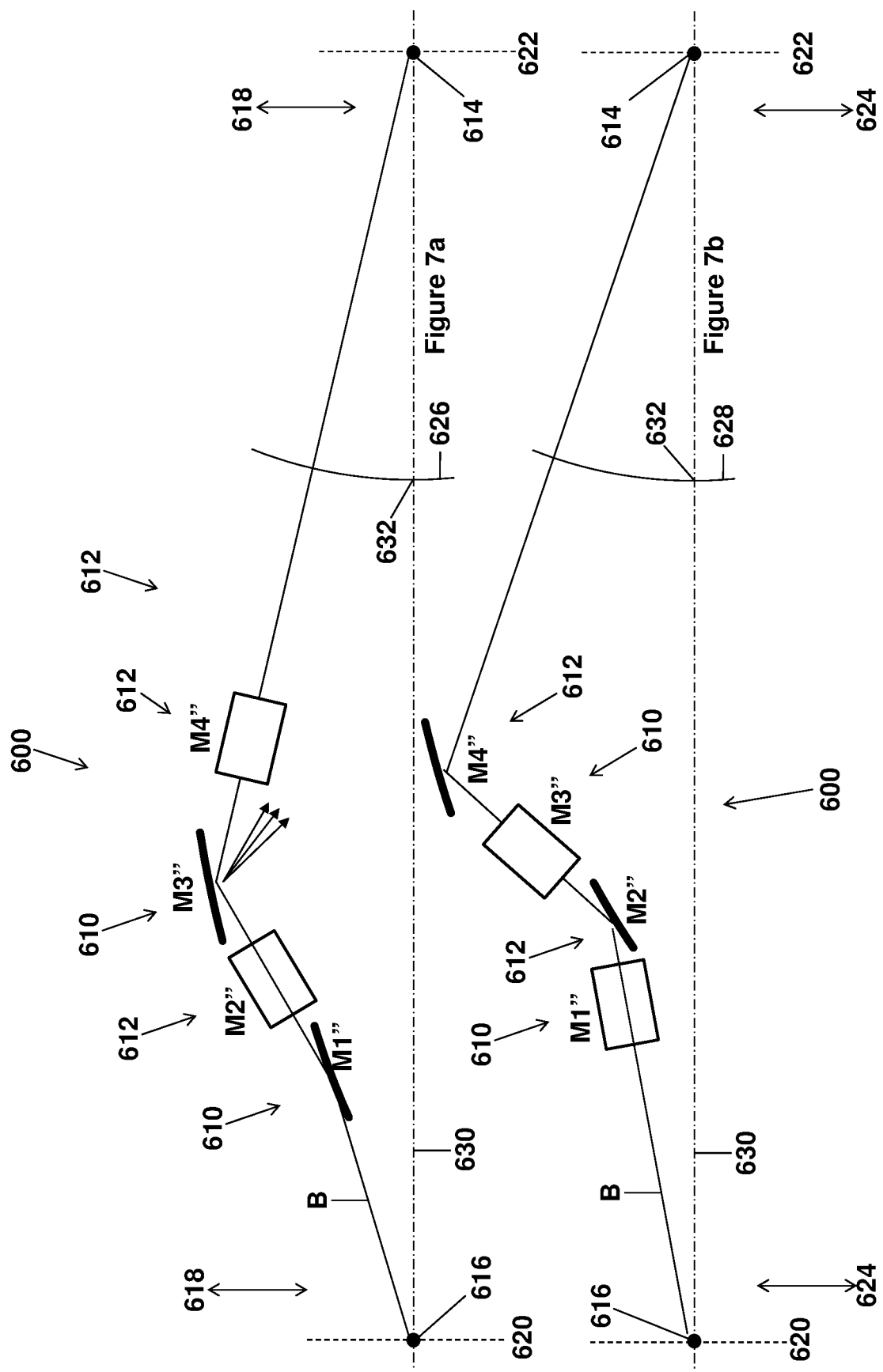

OPTICAL SYSTEM, METROLOGY APPARATUS AND ASSOCIATED METHOD

FIELD

The present invention relates to an optical system for, but not exclusively, a metrology apparatus and an associated method.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as $CD=k_1\times\lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low k1.

During the manufacturing process of an integrated circuit in which the lithographic apparatus is used, measurements may be performed on the structures printed on the substrate for process control and verification purposes. One option for performing measurements on the structures may be to use a metrology apparatus or inspection apparatus that employs a beam of soft X-ray (SXR) or EUV radiation capable of resolving characteristics of printed structures with dimensions such as may be created with low-$k_1$ lithography. Although various sources are available for generating a beam of SXR or EUV radiation, there are various challenges associated with manipulating the beam of radiation in a manner that satisfies certain criteria.

SUMMARY

It is an object of the invention to overcome disadvantages of known systems and/or challenges associated with known systems for manipulating a beam of radiation used in, but not exclusively, a metrology apparatus.

According to an aspect of the present invention there is provided an optical system for focusing a beam of radiation on a region of interest of a substrate in a metrology apparatus. The beam of radiation may comprise radiation in a soft X-ray or Extreme Ultraviolet spectral range. The optical system may comprise a first reflector system and a second reflector system. Each of the first and second reflector systems may comprise a finite-to-finite Wolter reflector system. The optical system may be configured to form, on the region of interest, a demagnified image of an object. The object may comprise an apparent source of the beam of radiation.

The optical system may be capable of manipulating the beam of radiation in a manner that fulfils certain criteria to enable measurements to be performed on structures in the region of interest. The finite-to-finite Wolter reflector system may allow an apparent source of the beam of radiation that is a finite distance away from the region of interest to be imaged with an imaging performance that fulfils the criteria. This finite-to-finite imaging capability may allow the optical system to be accommodated within a relatively compact volume. Further, the source of the beam of radiation may be provided in close proximity to the optical system to provide a compact package comprising the source and the optical system. The Wolter reflector system may provide certain benefits in terms of imaging objects that are not optimally aligned with respect to the axis of the optical system and/or where the object being imaged is non-point like. The Wolter reflector system may tolerate such non-optimum alignment and/or non-optimum object size to a degree that is greater than that achievable with certain other reflector systems for imaging beams of SXR or EUV radiation. In other words, the Wolter reflector system may fulfil the criteria even if the apparent source is off-axis and/or non-point like resulting in a finite (non-zero) field in the object plane. Use of the Wolter reflector system may ease stringent alignment requirements compared with certain other optical systems and/or provide greater tolerance to instability or movement of the optical system arising from use or transport. Thus, the Wolter reflector system may be aligned and manufactured with greater stability compared with certain other reflector systems. The imaging performance of the Wolter reflector system may be such that aberrations caused by the Wolter reflector system are less than those produced by certain other reflector systems. The Wolter reflector system may provide a greater degree of flexibility compared with certain other reflector systems in terms of demagnifying the object. The demagnification provided by each Wolter reflector system may be decoupled from each other so that each Wolter reflector system may independently provide a desired demagnification factor. In an example, the Wolter reflector systems may be configured to provide isomorphic imaging of the object, which may not be possible to achieve with certain other types of reflector systems.

Each finite-to-finite Wolter reflector system may comprise a one-dimensional finite-to-finite Wolter reflector system configured to demagnify the object in one direction taken along an object plane comprising the object to form a corresponding demagnified image of the object in a corresponding direction taken along an image plane comprising the image. The types of reflectors used in a one-dimensional Wolter reflector system may be curved in one direction. Such reflectors may be manufacturable with a surface quality and/or to a tolerance level that allows the optical system to provide imaging performance that satisfies the criteria. Such one-dimensional Wolter reflector systems may provide a lower cost level and/or more satisfactory imaging performance compared with currently available two-dimensional Wolter reflector systems comprising reflectors curved in two directions.

The first reflector system may be configured to demagnify the object in a first direction taken along the object plane to form a corresponding demagnified image of the object in a corresponding first direction taken along the image plane. The second reflector system may be configured to demagnify the object in a second direction taken along the object plane, the second direction being perpendicular to the first direction, to form a corresponding demagnified image of the object in a corresponding second direction taken along the image plane.

The optical system may be configured such that a free working distance defined between a component of the optical system and the region of interest is greater than or equal to 10 cm. The free working distance may be such as to permit the reflectors to be accommodated without causing volume conflicts with other components and/or the beam of radiation.

The optical system may be configured such that a principal surface of the first and second reflector systems intersects an axis defined between the object and the image at an intersection point that is closer to the image than the object. An intersection of the principal surface with an intersection point that is closer to the image than the object may provide a demagnification factor that may be defined by the ratio of the distance between the principal surface and the object ($s_o$) and the distance between the principal surface and the image ($s_i$), the ratio being equal to $s_o/s_i$ ($s_o$ over $s_i$).

The principal surface of the first reflector system may intersect the axis at substantially the same intersection point as the principal surface of the second reflector system. This may provide the same demagnification factor for both the first and second reflector systems, which may allow the optical system to form an isomorphic demagnified image of the object.

The optical system may be configured such that a demagnification factor of the first reflector system is substantially the same as the demagnification factor of the second reflector system. The demagnification factor may be defined by a ratio between a dimension of the object and a corresponding dimension of the image.

The optical system may be configured to image the object with a desired demagnification aspect ratio so as to form an isomorphic image or an anamorphic image of the object.

The optical system may be configured to de-magnify at least one dimension of the object by a demagnification factor of greater than or equal to 5, optionally greater than or equal to 8, optionally greater than or equal to 10. The Wolter reflector system may be capable of achieving a relatively high demagnification factor while still providing imaging performance that fulfils the criteria. Relatively high curvature reflectors may be used to provide a high demagnification factor. The Wolter reflector system configuration may provide acceptable imaging performance even for high curvature reflectors.

The first reflector system may be oriented relative to the second reflector system such that at least one plane of incidence intersecting the first reflector system is perpendicular to at least one plane of incidence intersecting the second reflector system.

The optical system may be configured such that a first plane of incidence intersects each reflector of the first reflector system and a second plane of incidence intersects each reflector of the second reflector system, the first and second planes of incidence being perpendicular to each other.

The optical system may be configured such that a first plane of incidence intersects a primary reflector of the first reflector system, a second plane of incidence intersects a primary reflector of the second reflector system, a third plane of incidence intersects a secondary reflector of the first reflector system and a fourth plane of incidence intersects a secondary reflector of the second reflector system, the first and third planes of incidence being non-parallel to each other, the second and fourth planes of incidence being non-parallel to each other and perpendicular to the first and third planes of incidence.

The optical system may be configured to focus the beam of radiation on the region of interest of a substrate so that information regarding the region of interest is determinable from radiation that is at least one of: reflected, scattered and diffracted from the region of interest, and optionally wherein the substrate may comprise an integrated circuit or is usable in the manufacture of an integrated circuit.

The optical system may comprise a Wolter type III reflector system and one of: an additional Wolter type III reflector system and a Wolter type I reflector system. The particular configuration of the Wolter type reflector systems provided as part of the optical system may be such as to provide space for other components in the vicinity of the reflectors such as an optional reference detector for measuring a portion of radiation diffracted from a reflector comprising a diffractive element.

A primary reflector of the Wolter type III reflector system may comprise an elliptic-cylindrical convex reflector. A secondary reflector of the Wolter type III reflector system may comprise an elliptic-cylindrical concave reflector.

A primary reflector of the Wolter type I reflector system may comprise an elliptic-cylindrical concave reflector. A secondary reflector of the Wolter type I reflector system may comprise a hyperbolic-cylindrical concave reflector.

The first reflector system may comprise the Wolter type III reflector system.

The second reflector system may comprise the additional Wolter type III reflector system.

The optical system may comprise, in sequence between the object and the image, the Wolter type III reflector system, followed by the additional Wolter type III reflector system.

The optical system may comprise, in sequence between the object and the image, a primary reflector of the Wolter type III reflector system, followed by a primary reflector of the additional Wolter type III reflector system, followed by a secondary reflector of the Wolter type III reflector system, followed by a secondary reflector of the additional Wolter type III reflector system.

The second reflector system may comprise the Wolter type I reflector system. The optical system may comprise, in sequence between the object and the image, the Wolter type III reflector system, followed by the Wolter type I reflector system.

At least one of the first reflector system and the second reflector system may comprise a diffractive element for spatially separating diffracted spectral components of the beam of radiation. The diffractive element may allow the performance of the source to be monitored and/or be used to analyze the spectral content of the beam for the purposes of metrology measurements.

The diffractive element may be provided as part of a secondary reflector of the first reflector system.

The optical system may be configured such that a pathlength of a chief ray defined between the object and the image is less than or equal to 3 meters, optionally less than or equal to 1.5 meters. The relatively short pathlength compared with certain other optical systems may permit the optical system to be accommodated within a relatively compact volume and/or footprint.

According to an aspect of the present invention there is provided a metrology or inspection apparatus. The metrology or inspection apparatus may comprise a substrate table for receiving and holding a substrate at a controllable position. The metrology or inspection apparatus may comprise a radiation source for generating a beam of illumination radiation. The metrology or inspection apparatus may comprise an optical system according to any aspect or embodiment for focusing the beam of illumination radiation at a region of interest on the substrate.

According to an aspect of the invention there is provided a method of using an optical system for focusing a beam of radiation on a region of interest of a substrate in a metrology apparatus. The beam of radiation may comprise radiation in a soft X-ray or Extreme Ultraviolet spectral range. The method may comprise providing an optical system comprising a first reflector system and a second reflector system. Each of the first and second reflector systems may comprise a finite-to-finite Wolter reflector system. The method may comprise forming, on the region of interest, a demagnified image of an object. The object may comprise an apparent source of the beam of radiation.

According to an aspect of the invention there is provided a metrology apparatus for determining a characteristic of interest of a portion of structure manufactured on a substrate. The metrology apparatus may comprise an optical system according to any aspect or embodiment described herein.

According to an aspect of the invention there is provided an inspection apparatus for inspecting a portion of a structure manufactured on a substrate. The inspection apparatus may comprise an optical system according to any aspect or embodiment described herein.

According to an aspect of the invention there is provided a litho cell. The litho cell may comprise a metrology or inspection apparatus according to any aspect or embodiment described herein.

At least one feature of any aspect or embodiment described herein may replace any corresponding feature of any aspect or embodiment described herein. At least one feature of any aspect or embodiment described herein may be combined with any other aspect or embodiment described herein.

BRIEF DESCRIPTION OF THE DRAWINGS

Embodiments of the invention will now be described, by way of example only, with reference to the accompanying schematic drawings, in which:

FIGS. 5a to 5b respectively depict schematic representations of an optical system according to an embodiment;

FIGS. 6a to 6b respectively depict schematic representations of an optical system according to another embodiment; and FIGS. 7a to 7b respectively depict schematic representations of an optical system according to another embodiment.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm) and SXR (soft X-ray radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
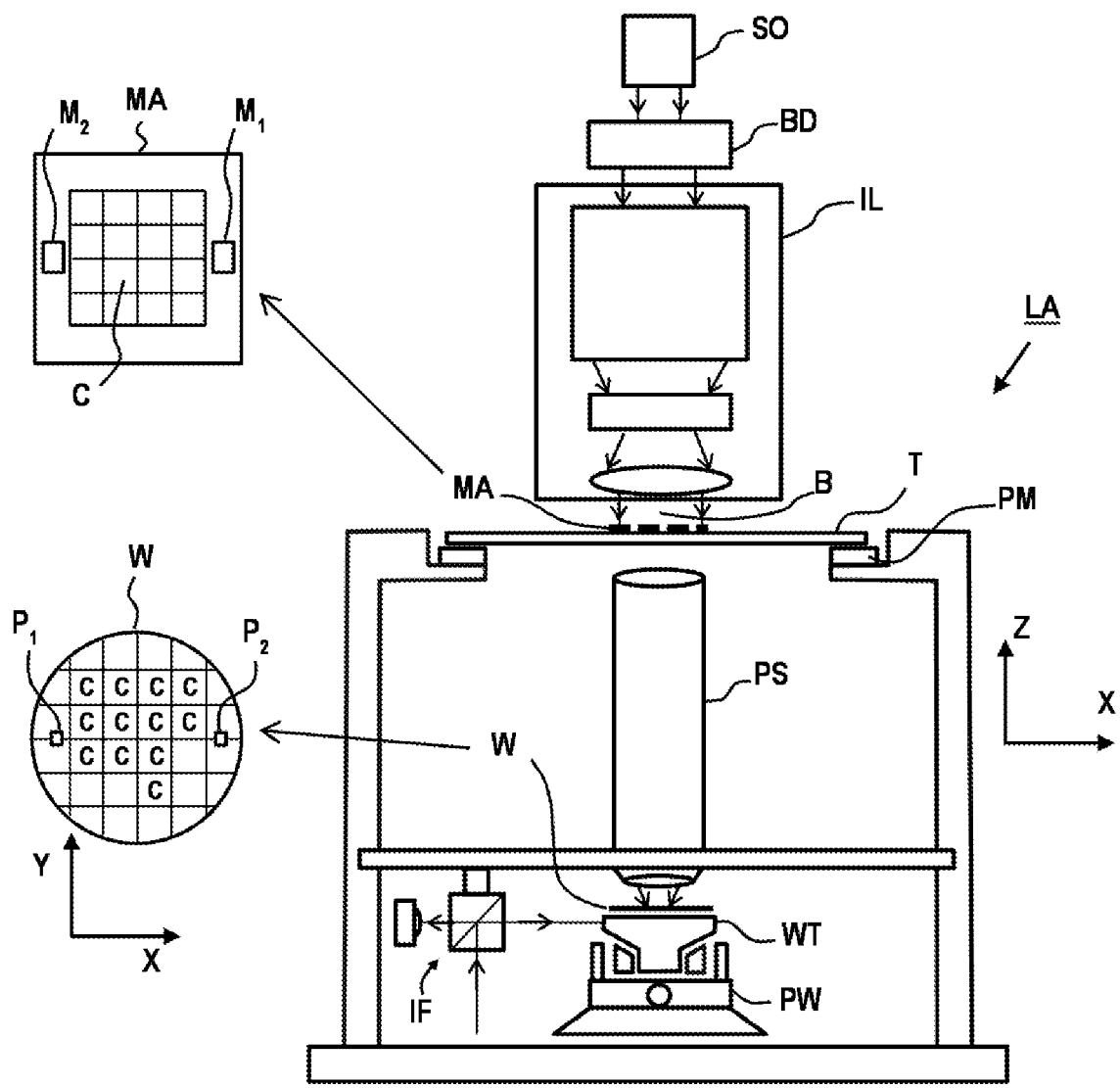
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, MTV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253 which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

Figure 2:
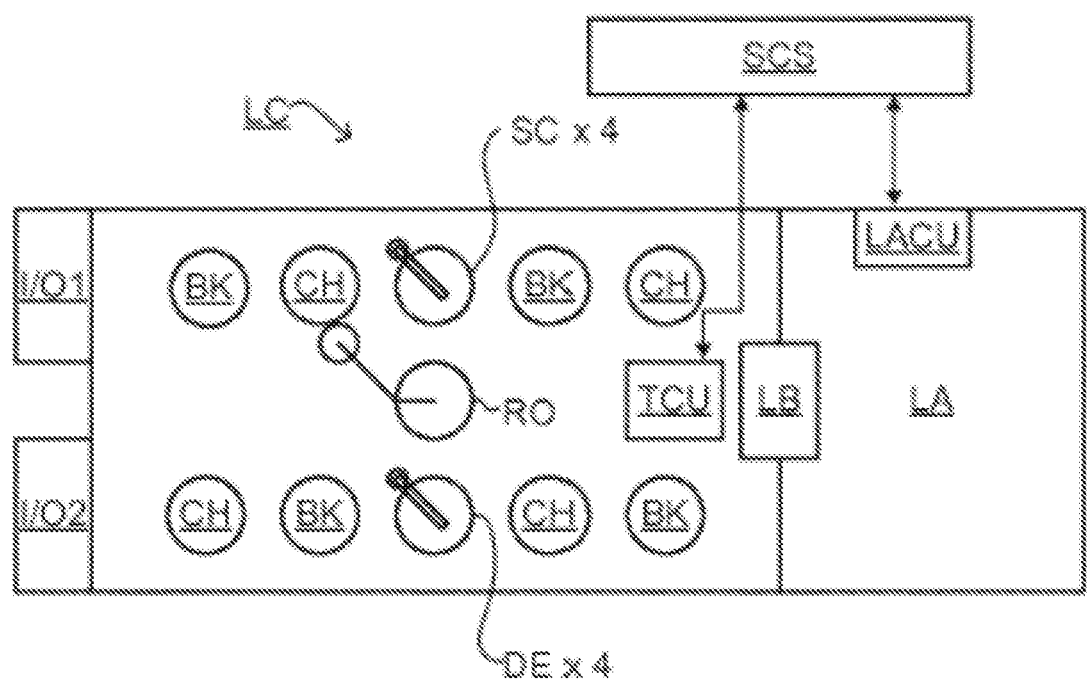
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 3:
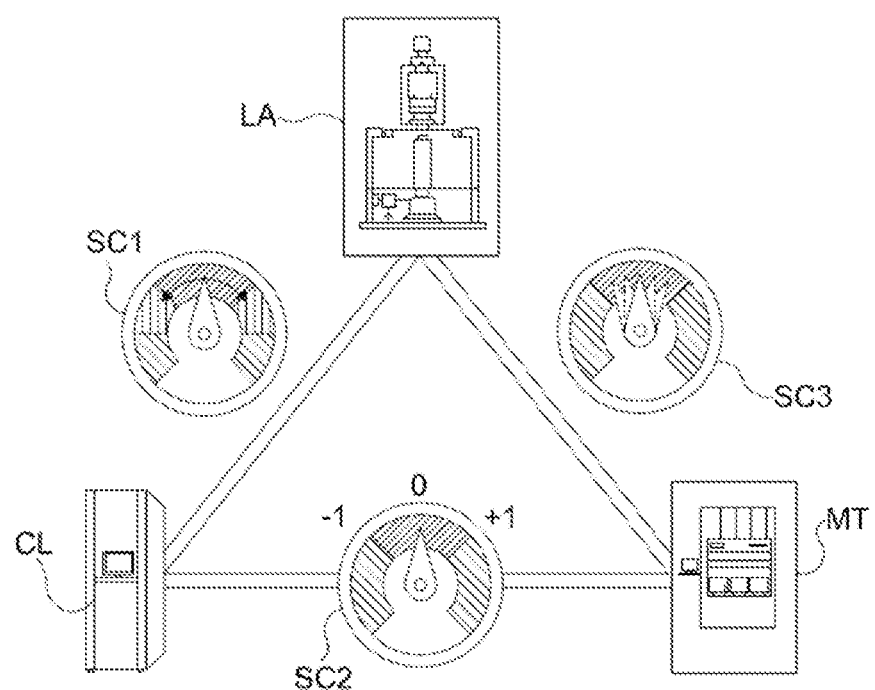
FIG. 3 depicts a schematic representation of holistic lithography, representing a cooperation between three key technologies to optimize semiconductor manufacturing.

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MT (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MT) to predict whether defects may be present due to e.g. sub-optimal processing (depicted in FIG. 3 by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

In lithographic processes, it is desirable to make frequently measurements of the structures created, e.g., for process control and verification. Tools to make such measurement are typically called metrology tools MT. Different types of metrology tools MT for making such measurements are known, including scanning electron microscopes or various forms of scatterometer metrology tools MT. Scatterometers are versatile instruments which allow measurements of the parameters of a lithographic process by having a sensor in the pupil or a conjugate plane with the pupil of the objective of the scatterometer, measurements usually referred as pupil based measurements, or by having the sensor in the image plane or a plane conjugate with the image plane, in which case the measurements are usually referred as image or field based measurements. Such scatterometers and the associated measurement techniques are further described in patent applications US20100328655, US2011102753A1, US20120044470A, US20110249244, US20110026032 or EP 1,628,164 A, incorporated herein by reference in their entirety. Aforementioned scatterometers may measure gratings using light from soft x-ray and visible to near-IR wavelength range.

In a first embodiment, the scatterometer MT is an angular resolved scatterometer. In such a scatterometer reconstruction methods may be applied to the measured signal to reconstruct or calculate properties of the grating. Such reconstruction may, for example, result from simulating interaction of scattered radiation with a mathematical model of the target structure and comparing the simulation results with those of a measurement. Parameters of the mathematical model are adjusted until the simulated interaction produces a diffraction pattern similar to that observed from the real target.

In a second embodiment, the scatterometer MT is a spectroscopic scatterometer MT. In such spectroscopic scatterometer MT, the radiation emitted by a radiation source is directed onto the target and the reflected or scattered radiation from the target is directed to a spectrometer detector, which measures a spectrum (i.e. a measurement of intensity as a function of wavelength) of the specular reflected radiation. From this data, the structure or profile of the target giving rise to the detected spectrum may be reconstructed, e.g. by Rigorous Coupled Wave Analysis and non-linear regression or by comparison with a library of simulated spectra.

In a third embodiment, the scatterometer MT is an ellipsometric scatterometer. The ellipsometric scatterometer allows for determining parameters of a lithographic process by measuring scattered radiation for each polarization states. Such metrology apparatus emits polarized light (such as linear, circular, or elliptic) by using, for example, appropriate polarization filters in the illumination section of the metrology apparatus. A source suitable for the metrology apparatus may provide polarized radiation as well. Various embodiments of existing ellipsometric scatterometers are described in U.S. patent application Ser. Nos. 11/451,599, 11/708,678, 12/256,780, 12/486,449, 12/920,968, 12/922, 587, 13/000,229, 13/033,135, 13/533,110 and 13/891,410 incorporated herein by reference in their entirety.

In one embodiment of the scatterometer MT, the scatterometer MT is adapted to measure the overlay of two misaligned gratings or periodic structures by measuring asymmetry in the reflected spectrum and/or the detection configuration, the asymmetry being related to the extent of the overlay. The two (typically overlapping) grating structures may be applied in two different layers (not necessarily consecutive layers), and may be formed substantially at the same position on the wafer. The scatterometer may have a symmetrical detection configuration as described e.g. in co-owned patent application EP 1,628,164 A, such that any asymmetry is clearly distinguishable. This provides a straightforward way to measure misalignment in gratings. Further examples for measuring overlay error between the two layers containing periodic structures as target is measured through asymmetry of the periodic structures may be found in PCT patent application publication no. WO 2011/012624 or US patent application US 20160161863, incorporated herein by reference in its entirety.

Other parameters of interest may be focus and dose. Focus and dose may be determined simultaneously by scatterometry (or alternatively by scanning electron microscopy) as described in US patent application US2011-0249244, incorporated herein by reference in its entirety. A single structure may be used which has a unique combination of critical dimension and sidewall angle measurements for each point in a focus energy matrix (FEM—also referred to as Focus Exposure Matrix). If these unique combinations of critical dimension and sidewall angle are available, the focus and dose values may be uniquely determined from these measurements.

A metrology target may be an ensemble of composite gratings, formed by a lithographic process, mostly in resist, but also after etch process for example. Typically the pitch and line-width of the structures in the gratings strongly depend on the measurement optics (in particular the NA of the optics) to be able to capture diffraction orders coming from the metrology targets. As indicated earlier, the diffracted signal may be used to determine shifts between two layers (also referred to 'overlay') or may be used to reconstruct at least part of the original grating as produced by the lithographic process. This reconstruction may be used to provide guidance of the quality of the lithographic process and may be used to control at least part of the lithographic process. Targets may have smaller sub-segmentation which are configured to mimic dimensions of the functional part of the design layout in a target. Due to this sub-segmentation, the targets will behave more similar to the functional part of the design layout such that the overall process parameter measurements resembles the functional part of the design layout better. The targets may be measured in an underfilled mode or in an overfilled mode. In the underfilled mode, the measurement beam generates a spot that is smaller than the overall target. In the overfilled mode, the measurement beam generates a spot that is larger than the overall target. In such overfilled mode, it may also be possible to measure different targets simultaneously, thus determining different processing parameters at the same time.

Overall measurement quality of a lithographic parameter using a specific target is at least partially determined by the measurement recipe used to measure this lithographic parameter. The term "substrate measurement recipe" may include one or more parameters of the measurement itself, one or more parameters of the one or more patterns measured, or both. For example, if the measurement used in a substrate measurement recipe is a diffraction-based optical measurement, one or more of the parameters of the measurement may include the wavelength of the radiation, the polarization of the radiation, the incident angle of radiation relative to the substrate, the orientation of radiation relative to a pattern on the substrate, etc. One of the criteria to select a measurement recipe may, for example, be a sensitivity of one of the measurement parameters to processing variations. More examples are described in US patent application US2016-0161863 and published US patent application US 2016/0370717A1 incorporated herein by reference in its entirety.

As an alternative to optical metrology methods, it has also been considered to use soft X-rays or EUV radiation, for example radiation in a wavelength range between 0.1 nm and 100 nm, or optionally between 1 nm and 50 nm, or optionally between 5 and 100 nm, or optionally between 1.0 nm and 20 nm. One example of metrology tool functioning in one of the above presented wavelength ranges is transmissive small angle X-ray scattering (T-SAXS as in US 2007224518A which content is incorporated herein by reference in its entirety). Profile (CD) measurements using T-SAXS are discussed by Lemaillet et al in "Intercomparison between optical and X-ray scatterometry measurements of FinFET structures", Proc. of SPIE, 2013, 8681. Reflectometry techniques using X-rays (GI-XRS) and extreme ultraviolet (EUV) radiation at grazing incidence are known for measuring properties of films and stacks of layers on a substrate. Within the general field of reflectometry, goniometric and/or spectroscopic techniques can be applied. In goniometry, the variation of a reflected beam with different incidence angles is measured. Spectroscopic reflectometry, on the other hand, measures the spectrum of wavelengths reflected at a given angle (using broadband radiation). For example, EUV reflectometry has been used for inspection of mask blanks, prior to manufacture of reticles (patterning devices) for use in EUV lithography.

It is possible that the range of application makes the use of wavelengths in the soft X-rays or EUV domain not sufficient. Therefore published patent applications US 20130304424A1 and US2014019097A1 (Bakeman et al/KLA) describe hybrid metrology techniques in which measurements made using x-rays and optical measurements with wavelengths in the range 120 nm and 2000 nm are combined together to obtain a measurement of a parameter such as CD. A CD measurement is obtained by coupling and x-ray mathematical model and an optical mathematical model through one or more common. The content of the cited US patent applications are incorporated herein by reference in their entirety.

In the context of this document the term HHG or HHG source is introduced. HHG refers to High Harmonic Generation or sometimes referred to as high order harmonic generation. HHG is a non-linear process in which a target, for example a gas, a plasma or a solid sample, is illuminated by an intensive laser pulse. Subsequently, the target may emit radiation with a frequency that is a multiple of the frequency of the radiation of the laser pulse. Such frequency, that is a multiple, is called a harmonic of the radiation of the laser pulse. One may define that the generated HHG radiation is a harmonic above the fifth harmonic and these harmonics are termed high harmonics. The physical process that forms a basis of the HHG process is different from the physical process that relates to generating radiation of the lower harmonics, typically the 2nd to 5th harmonic. The generation of radiation of the lower harmonic relates to perturbation theory. The trajectory of the (bound) electron of an atom in the target is substantially determined by the Coulomb potential of the host ion. In HHG, the trajectory of the electron that contributes to the HHG process is substantially determined by the electric field of the incoming laser light. In the so-called "three step model" describing HHG, electrons tunnel through the Coulomb barrier which is at that moment substantially suppressed by the laser field (step 1), follow a trajectory determined by the laser field (step 2) and recombine with a certain probability while releasing their kinetic energy plus the ionization energy in the form of radiation (step 3). Another way of phrasing a difference between HHG and the generation of radiation of the lower harmonic is to define that all radiation with photon energy above the ionization energy of the target atoms as "High Harmonic" radiation, e.g. HHG generated radiation, and all radiation with photon energy below the ionization energy as non-HHG generated radiation. If Neon is used as a gas target, all radiation with a wavelength shorter than 62 nm (having a photon energy higher than 20.18 eV) is generated by means of the HHG process. For Argon as a gas target, all radiation having a photon energy higher than about 15.8 eV is generated by means of the HHG process.

Figure 4:
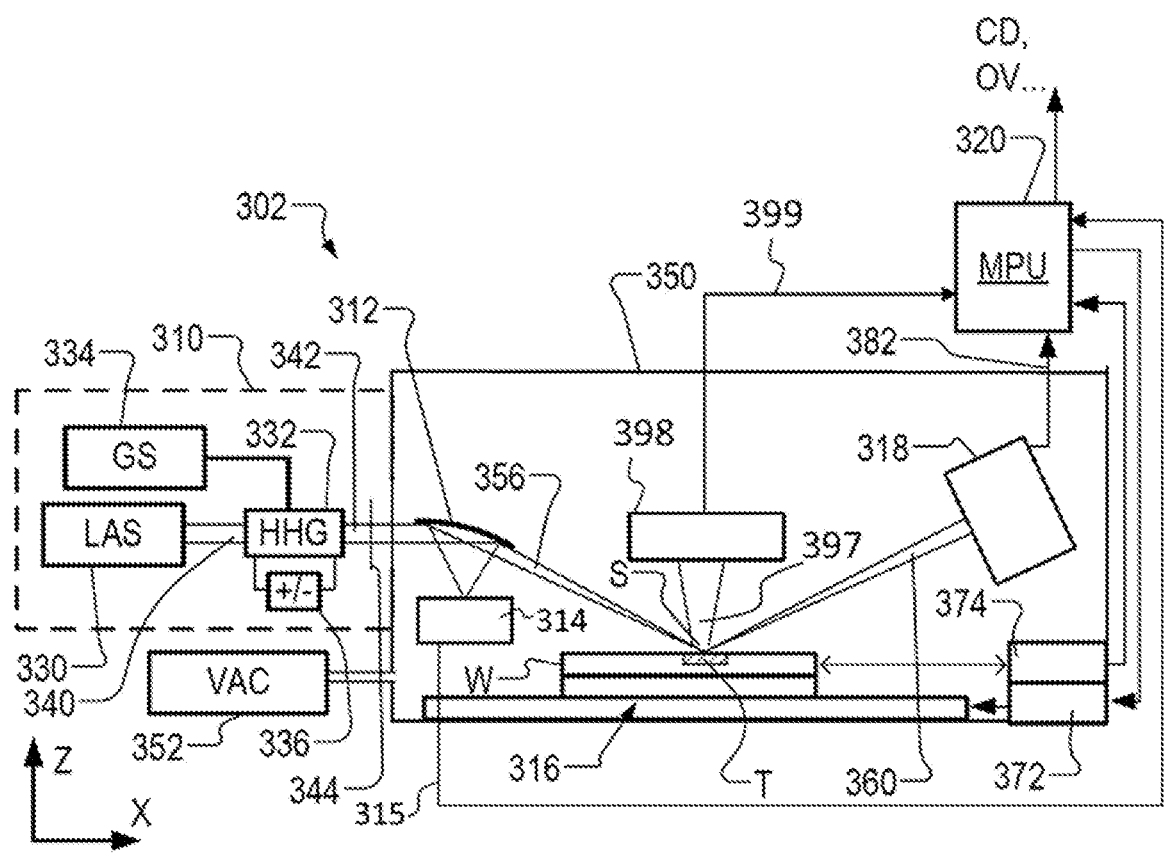
FIG. 4 depicts a schematic representation of a metrology apparatus.

FIG. 4 depicts a schematic representation of a metrology apparatus 302 in which radiation in the wavelength range from 0.1 nm to 100 nm may be used to measure parameters of structures on a substrate. The metrology apparatus 302 presented in FIG. 4 is suitable for the soft X-rays or EUV domain.

FIG. 4 illustrates a schematic physical arrangement of a metrology apparatus 302 comprising a spectroscopic scatterometer using EUV and/or SXR radiation in grazing incidence, purely by way of example. An alternative form of inspection apparatus might be provided in the form of an angle-resolved scatterometer, which uses radiation in normal or near-normal incidence similar to the conventional scatterometers operating at longer wavelengths.

Inspection apparatus 302 comprises a radiation source 310, illumination system 312, substrate support 316, detection systems 318, 398 and metrology processing unit (MPU) 320.

Source 310 in this example comprises a generator of EUV or soft x-ray radiation based on high harmonic generation (HHG) techniques. Such sources are available for example from KMLabs, Boulder Colo., USA (http://www.kmlabs.com/). Main components of the radiation source are a drive laser 330 and an HHG gas cell 332. A gas supply 334 supplies suitable gas to the gas cell, where it is optionally ionized by an electric source 336. The drive laser 300 may be, for example, a fiber-based laser with an optical amplifier, producing pulses of infrared radiation that may last for example less than 1 ns (1 nanosecond) per pulse, with a pulse repetition rate up to several megahertz, as required. The wavelength of the infrared radiation may be for example in the region of 1 μm (1 micron), The laser pulses are delivered as a first radiation beam 340 to the HHG gas cell 332, where in the gas a portion of the radiation is converted to higher frequencies than the first radiation into a beam 342 including coherent second radiation of the desired wavelength or wavelengths.

The second radiation may contain multiple wavelengths. If the radiation were monochromatic, then measurement calculations (for example reconstruction) may be simplified, but it is easier with HHG to produce radiation with several wavelengths. The volume of gas within the gas cell 332 defines an HHG space, although the space need not be completely enclosed and a flow of gas may be used instead of a static volume. The gas may be for example a noble gas such as neon (Ne) or argon (Ar). N2, O2, He, Ar, Kr, Xe gases can all be considered. These are matters of design choice, and may even be selectable options within the same apparatus. Different wavelengths will, for example, provide different levels of contrast when imaging structure of different materials. For inspection of metal structures or silicon structures, for example, different wavelengths may be selected to those used for imaging features of (carbon-based) resist, or for detecting contamination of such different materials. One or more filtering devices 344 may be provided. For example a filter such as a thin membrane of Aluminum (Al) may serve to cut the fundamental IR radiation from passing further into the inspection apparatus 302. A grating (not shown) may be provided to select one or more specific harmonic wavelengths from among those generated in the gas cell. Some or all of the beam path may be contained within a vacuum environment, bearing in mind that SXR radiation is absorbed when traveling in air. The various components of radiation source 310 and illumination optics 312 can be adjustable to implement different metrology 'recipes' within the same apparatus. For example different wavelengths and/or polarization can be made selectable.

Depending on the materials of the structure under inspection, different wavelengths may offer a desired level of penetration into lower layers. For resolving the smallest device features and defects among the smallest device features, then a short wavelength is likely to be preferred. For example, one or more wavelengths in the range 1-20 nm or optionally in the range 1-10 nm or optionally in the range 10-20 nm may be chosen. Wavelengths shorter than 5 nm suffer from very low critical angle when reflecting off materials typically of interest in semiconductor manufacture. Therefore to choose a wavelength greater than 5 nm will provide stronger signals at higher angles of incidence. On the other hand, if the inspection task is for detecting the presence of a certain material, for example to detect contamination, then wavelengths up to 50 nm could be useful.

From the radiation source 310, the filtered beam 342 enters an inspection chamber 350 where the substrate W including a structure of interest is held for inspection at a measurement position by substrate support 316. The structure of interest is labeled T. The atmosphere within inspection chamber 350 is maintained near vacuum by vacuum pump 352, so that EUV radiation can pass with-out undue attenuation through the atmosphere. The Illumination system 312 has the function of focusing the radiation into a focused beam 356, and may comprise for example a two-dimensionally curved mirror, or a series of one-dimensionally curved mirrors, as described in published US patent application US2017/0184981A1 (which content is incorporated herein by reference in its entirety), mentioned above. The focusing is performed to achieve a round or elliptical spot S under 10 μm in diameter, when projected onto the structure of interest. Substrate support 316 comprises for example an X-Y translation stage and a rotation stage, by which any part of the substrate W can be brought to the focal point of beam to in a desired orientation. Thus the radiation spot S is formed on the structure of interest. Alternatively, or additionally, substrate support 316 comprises for example a tilting stage that may tilt the substrate W at a certain angle to control the angle of incidence of the focused beam on the structure of interest T (e.g. at a region of interest).

Optionally, the illumination system 312 provides a reference beam of radiation to a reference detector 314 which may be configured to measure a spectrum and/or intensities of different wavelengths in the filtered beam 342. The reference detector 314 may be configured to generate a signal 315 that is provided to processor 310 and the filter may comprise information about the spectrum of the filtered beam 342 and/or the intensities of the different wavelengths in the filtered beam.

Reflected radiation 360 is captured by detector 318 and a spectrum is provided to processor 320 for use in calculating a property of the target structure T. The illumination system 312 and detection system 318 thus form an inspection apparatus. This inspection apparatus may comprise an soft X-ray and/or EUV spectroscopic reflectometer of the kind described in US2016282282A1 which content is incorporated herein by reference in its entirety.

If the target T has a certain periodicity, the radiation of the focused beam 356 may be partially diffracted as well. The diffracted radiation 397 follows another path at well-defined angles with respect to the angle of incidence then the reflected radiation 360. In FIG. 4, the drawn diffracted radiation 397 is drawn in a schematic manner and diffracted radiation 397 may follow many other paths than the drawn paths. The inspection apparatus 302 may also comprise further detection systems 398 that detect and/or image at least a portion of the diffracted radiation 397. In FIG. 4 a single further detection system 398 is drawn, but embodiments of the inspection apparatus 302 may also comprise more than one further detection system 398 that are arranged at different positions to detect and/or image diffracted radiation 397 at a plurality of diffraction directions. In other words, the (higher) diffraction orders of the focused radiation beam that impinges on the target T are detected and/or imaged by one or more further detection systems 398. The one or more detection systems 398 generates a signal 399 that is provided to the metrology processor 320. The signal 399 may include information of the diffracted light 397 and/or may include images obtained from the diffracted light 397.

To aid the alignment and focusing of the spot S with desired product structures, inspection apparatus 302 may also provide auxiliary optics using auxiliary radiation under control of metrology processor 320. Metrology processor 320 can also communicate with a position controller 372 which operates the translation stage, rotation and/or tilting stages. Processor 320 receives highly accurate feedback on the position and orientation of the substrate, via sensors. Sensors 374 may include interferometers, for example, which can give accuracy in the region of picometers. In the operation of the inspection apparatus 302, spectrum data 382 captured by detection system 318 is delivered to metrology processing unit 320.

As mentioned an alternative form of inspection apparatus uses soft X-ray and/or EUV radiation at normal incidence or near-normal incidence, for example to perform diffraction-based measurements of asymmetry. Both types of inspection apparatus could be provided in a hybrid metrology system. Performance parameters to be measured can include overlay (OVL), critical dimension (CD), coherent diffraction imaging (CDI) and at-resolution overlay (ARO) metrology. The soft X-ray and/or EUV radiation may for example have wavelengths less than 100 nm, for example using radiation in the range 5-30 nm, of optionally in the range from 10 nm to 20 nm. The radiation may be narrowband or broadband in character. The radiation may have discrete peaks in a specific wavelength band or may have a more continuous character.

Like the optical scatterometer used in today's production facilities, the inspection apparatus 302 can be used to measure structures within the resist material treated within the litho cell (After Develop Inspection or ADI), and/or to measure structures after they have been formed in harder material (After Etch inspection or AEI). For example, substrates may be inspected using the inspection apparatus 302 after they have been processed by a developing apparatus, etching apparatus, annealing apparatus and/or other apparatus.

Embodiments of this disclosure relate to optical systems for providing the function of the illumination system 312 depicted by FIG. 4. The metrology apparatus 302 is designed to meet a required specification for a particular application of the metrology apparatus 302. For example, the metrology apparatus 302 may be configured to inspect substrates to measure properties of patterned structures created in those substrates by the lithographic apparatus LA. Certain properties of the patterned structures may only be determined if the metrology apparatus 302 meets the required specification for that particular application. The optical system may therefore be configured to fulfil certain criteria that allow the metrology apparatus 302 to meet the required specification. For example, the optical system may be designed to provide the focused beam 356 with one or more properties such that the beam 356 interaction with the structure of interest allows information regarding that structure of interest to be determined with the metrology apparatus 302 according to the specification. The degree of freedom in designing the optical system depends on one or more boundary conditions. Thus, the ability of the optical system to fulfil certain criteria depends on the one or more boundary conditions.

The optical system may be configured to focus the beam of radiation on the region of interest of a substrate so that information regarding the region of interest is determinable from radiation that is at least one of: reflected, scattered and diffracted from the region of interest. Thus, the metrology apparatus 302 may be configured for determining information regarding the region of interest of an integrated circuit with parameters of the metrology apparatus 302 appropriately selected for determining such information.

Examples of boundary conditions include, but are not limited to: the spectral content of the filtered beam 342, a dimension and/or aspect ratio of the beam 342 (e.g. at an apparent source of the beam 342 defining an object being imaged by the optical system), the quality of the beam 342 (e.g. an M-squared value), spatial and/or spectral variations of the beam 342, the energy and/or power of the beam 342, any other operating characteristic of the radiation source 310, the transmittance of the optical system, the available space for the components of the optical system and volume conflicts between components of the metrology apparatus 302 such as the reference detector 314 and/or conflicts of such components with the beam of radiation. In addition, one or more boundary conditions may change during use depending on the particular application. For example, one or more components of the metrology apparatus 302 may be moved or replaced during use, which may affect the available space for the components of the optical system. Another example is that the radiation source 310 may be configured in different operating regimes, for example, to provide the beam 342 with a particular spectral content and/or another operating characteristics of the beam may be varied.

One or more embodiments of the optical system may be configured such that the metrology apparatus 302 meets a required specification depending on one or more boundary conditions. In one example specification, the beam 356 is focused by the optical system to achieve a round or elliptical spot S under 10 μm in diameter, when projected onto the structure of interest. In this example, a boundary condition may be defined by at least one dimension (e.g. radius, diameter, or the like) of the apparent source of the focused beam 356. When observed from the far field, the apparent source may define an object where the source of the beam 356 appears to originate from. The optical system therefore projects an image of that object onto the structure of interest where the corresponding at least one dimension of that image may depend on one or more of: (i) the at least one dimension of the object; (ii) the imaging properties of the optical system; and (iii) the quality of the beam 342 being imaged by the optical system.

In an example, the at least one dimension of the object may be such that the optical system fulfils certain criteria by demagnifying at least one dimension of the object by a demagnification factor defined by the ratio between a dimension of the object ($d_o$) and a corresponding dimension of the image ($d_i$) where the demagnification factor=$d_o/d_i$. For a Gaussian beam, the dimension may be defined according to an encircling radius of the object or image at $1/e^2$ (i.e. 13.5%) of the maximum intensity of the object or image. The optical system may be configured to de-magnify at least one dimension of the object by a demagnification factor of greater than 1, or optionally greater than or equal to: 2, 5, 8, 10, 15, 20 or 25.

In an example, a spot S dimension at the region of interest may be defined according to an encircling radius of the image at $1/e^2$ (i.e. 13.5%) of the maximum intensity of the image spot radius may be equal to or less than at least one of: 5, 4, 3, 2, 1.5, 1.25, 1, 0.75, 0.66 and 0.5 microns. It will be appreciated that the spot S dimension may not be equal in all directions (e.g. if the beam spot is non-circular) and thus, the beam spot radii defined above may refer to the largest radius of the beam spot.

In an example, the at least one dimension of the object may be such that the optical system fulfils certain criteria by imaging the object with a desired demagnification aspect ratio so as to form an isomorphic image or an anamorphic image of the object. The aspect ratio of the object or image may be defined by the ratio between a first dimension of the object or image and a second dimension of the object or image. The first dimension of the object may be measured in a first direction taken along an object plane comprising the object. The second dimension of the object may be measured in a second direction taken along the object plane, the second direction being perpendicular to the first direction. Similarly, the first dimension of the image may be measured in a first direction taken along an image plane comprising the image, where the first direction of the image corresponds to the first direction of the object. Further, the second dimension of the image may be measured in a second direction taken along the image plane, where the second direction of the image corresponds to the second direction of the object.

Therefore, the optical system may be configured such that the object is demagnified in the first direction taken along the object plane to form a corresponding demagnified image of the object in the corresponding first direction taken along the image plane. In addition, the optical system may be configured such that object is demagnified in the second direction taken along the object plane to form a corresponding demagnified image of the object in the corresponding second direction taken along the image plane.

The demagnification factor in the first and second directions may affect the aspect ratio of the image formed of the object. If the demagnification factor is the same in both the first and second directions, the image may be an isomorphic image having the same aspect ratio as the object. On the other hand, if the demagnification factor is different in the first and second directions, the image may be an anamorphic image having a different aspect ratio to the object being imaged. The shape of the object in the object plane may be circular or non-circular (e.g. elliptical). Depending on the criteria to be fulfilled, the optical system may be configured such that a circular or non-circular object may be demagnified to form any of: a circular and non-circular image of that circular or non-circular object.

In an example, a boundary condition may be defined by a potential volume conflict between the optical system and the substrate W. For example, a free working distance may be defined between a component of the optical system and a region of interest of the substrate W in order to prevent a volume conflict between the component and the substrate and/or the focused beam 356. In an example, the component of the optical system may comprise a reflector that is closer to the region of interest than any other reflector of the optical system. In this example, the free working distance may be defined between a surface of the reflector and the region of interest or between a surface of the component associated with the reflector (such as a mounting component) and the region of interest. The free working distance between a component of the optical system and a region of interest of the substrate W may be greater than or equal to: 10 cm, 15 cm or 20 cm. The free working distance may be measured between region of interest and the surface of the component closest to the region of interest.

In an example, a boundary condition may be defined by the pathlength of a chief ray defined between the object and the image. One or more optical systems described herein may be configured with a relatively short pathlength between the object and the image compared with other examples of optical systems. A relatively short pathlength between the object and the image may allow the optical system to be provided within a relatively compact volume or footprint or such as to allow the optical system to be accommodated within an available space. One or more optical systems described herein having a relatively short pathlength between the object and the image may have a pathlength that is less than or equal to: 3, 2.5, 2, 1.5, 1.25, 1.1 or 1 meter(s). It has been recognized that obtaining a relatively large, which may be greater than or equal to 10 cm, free working distance defined between a component of the optical system and the region of interest is difficult with such short pathlength between the object and the image. The inventors have realized that the embodiments in the following text are capable of providing this relatively large working distance.

In an example, a boundary condition may be defined by the numeral aperture (NA) of the optical system with respect to a beam of radiation focused on the region of interest. This numerical aperture may be greater than or equal to at least one of: 0.005, 0.01, 0.05 and 0.1. If a certain numerical aperture range of the optical system fulfils certain criteria, this numerical aperture range may affect or be affected by other boundary conditions such as the available range of pathlengths for the optical system and the at least one dimension of the object.

In an example, a boundary condition may be defined by a range of grazing angle of incidence (GAOI) that can be accepted by one or more reflectors of the optical system. At least one reflector of any optical system described herein may be oriented such that a chief ray of the beam of radiation has a GAOI on the reflector of greater than or equal to at least one of: 1, 2, 3, 4, 5, 6, 7, 8, 9 and 10 degrees. In a further example, the acceptable GAOI may be in the range 1 to 20 degrees. In a further example, the acceptable GAOI may be greater than 10 degrees, for example, in the range 10 to 20 degrees. The GAOI may be defined as the angle between the surface of the reflector and the incident ray. Grazing incidence optics may be used for providing total external reflection of a beam of radiation comprising e.g., EUV, SXR and/or X-ray wavelengths.

In an example, a boundary condition may be defined by a divergence of the beam of radiation at the object. At least one reflector of the optical system may be configured to receive the beam of radiation where the beam of radiation has a divergence half-angle of greater than or equal to at least one of: 1, 2, 3, 5, 10, 15, 20 and 25 mrad. For a Gaussian beam, the divergence half-angle of the beam of radiation B may be defined by the expression $\theta \approx \lambda_0/(\pi n w_0)$ where $\lambda_0$ is the wavelength, n is the refractive index and $w_0$ is the beam waist radius. The divergence is related to the numerical aperture or acceptance numerical aperture of the optical system. The numerical aperture may be about 2× the expected (Gaussian) beam divergence half-angle $\theta$. In an example, the optical system may be designed such that 99.99% of the energy of the beam of radiation may be within the imaged spot at the region of interest. In more general terms, divergence or convergence may be defined as half the apex angle of a beam cone at the $1/e^2$ (13.5%) intensity level. The beam may have the same or different divergence half-angles in the first and second directions, which may be perpendicular directions defined along the object plane. Although the divergence half-angle or numerical aperture values for the first and second directions may be different, they may still be of a similar order of magnitude. If a certain divergence half-angle or numerical aperture range is used to fulfil the criteria, this divergence half-angle or numerical aperture range may affect or be affected by other boundary conditions such as transmittance of the optical system, volume conflicts, or the like.

Throughout this disclosure and where appropriate, the term "divergence" may refer to the divergence half-angle defined above. However, where appropriate, the term "numerical aperture" may be more appropriate if referring to the properties of the optical system itself. The numerical aperture NA may be calculated using the maximum half-angle that may propagate through the optical system. Since the divergence half-angle is defined at the $1/e^2$ intensity level, depending on the imaging criterion, the maximum half-angle may be larger than the divergence half-angle, for example, so that 99.99% of the energy of the beam of radiation may be within the imaged spot at the region of interest. Typically, it may be assumed that the maximum half-angle that may propagate through the system is slightly more than about 2 times larger than the divergence half-angle. However, the ratio between the maximum half-angle and the divergence half angle may be different, for example, less than or more than 2.

In an example, a boundary condition may be defined by the transmittance of the optical system. The transmittance of the optical system may be greater than or equal to: 0.1, 0.2, 0.3 or 0.4. If a certain transmittance range is used to fulfil the criteria, this transmittance range may affect or be affected by other boundary conditions such as available range of beam divergence for the optical system, or the like.

In an example, a boundary condition may be defined by the dimensions of one or more reflectors of the optical system. The reflector dimensions may be such that substantially the whole beam of radiation is reflected (e.g. greater than or equal to at least one of: 50%, 60%, 70%, 80%, 90%, 95%, 99% of the energy of the beam is reflected) providing there are no volume conflicts between the reflectors and other reflectors or other components.

In an example, a boundary condition may be defined by the manufacturability of one or more reflectors of the optical system. In order to fulfil certain criteria, one or more reflectors may be manufactured within certain design and/or tolerance considerations. While certain reflector designs may be desirable in order to fulfil certain criteria, these designs may not be permitted if the manufacturability of those reflector designs falls outside one or more boundary conditions. For example, it may not be possible to manufacture a reflector with a certain design that may otherwise be desirable for fulfilling certain criteria. Therefore, depending on the particular application, the availability/freedom to manufacture certain reflectors for the optical system may depend on the criteria to be fulfilled.

One or more boundary conditions may affect at least one other boundary condition, which may or may not result in the criteria being fulfilled. In addition, certain boundary conditions may be variable depending on the particular application of the metrology apparatus. Therefore, certain configurations of the optical system may fulfil the criteria within the defined boundary conditions. However, if one or more of the boundary conditions is varied, the configuration of the optical system may also be varied in order to fulfil the criteria.

As described in further detail below, the inventors have identified several optical systems that fulfil certain criteria for one or more boundary conditions. Each optical system described herein is configured for focusing a beam of radiation on a region of interest of a substrate in a metrology apparatus. The beam of radiation comprises radiation in a soft X-ray (SXR) and/or Extreme Ultraviolet (EUV) spectral range.

One or more optical systems described herein may fulfil certain criteria when configured according to one or more of the following examples. In an example, the optical system may be configured such that the beam of radiation may be incident on one or more reflectors of the optical system with a grazing angle of incidence. Thus, the optical system may provide acceptable imaging performance across a broad spectral range (e.g. for a beam of radiation with a spectral band between 10 and 20 nm). In an example, the optical system may be configured to provide a relatively high demagnification factor (e.g., of order 10) between the object and the image. In an example, the optical system may be configured to focus the beam of radiation on the region of interest with a relatively large numerical aperture (e.g., of order 0.1—for example, 0.05). In an example, the optical system may be configured with a relatively short pathlength (e.g., of order 1.5 meters) between the object and the image. Thus, the optical system may be accommodated within a relatively compact volume or footprint. In an example, the optical system may comprise reflectors with strong curvatures in order to provide the relatively short pathlength and/or high numerical aperture. The particular type of reflectors used in the optical system may allow the relatively short pathlength and/or high numerical aperture to be provided while also providing imaging performance that fulfils certain criteria. In an example, the surface profile of the reflectors of the optical system may have a shape and/or surface quality that is manufacturable such that the optical system may provide imaging performance that fulfils certain criteria. In an example, components of the optical system may be configured to be aligned in a stable configuration such that a certain deviation from an optimum alignment still results in an imaging performance that fulfils certain criteria. Thus, the optical system may have a relatively relaxed alignment tolerance compared with other optical systems that may otherwise fulfil certain other criteria described herein. In an example, if the apparent source is not a point source and/or if the apparent source is off-axis, the optical system may still provide imaging performance that fulfils certain criteria due to the optical system correctly imaging off-axis as well as on-axis parts of the object (i.e., the optical system may still satisfy Abbe's sine condition even if the apparent source is not an exact point and/or if at least part of the apparent source is off-axis). That is, compared with other optical systems, optical systems described herein may provide an improved imaging performance in terms of still satisfying the Abbe sine condition even if the apparent source has, to a certain extent, a finite (non-zero) field in the object plane where those other optical systems would not satisfy the sine condition.

FIGS. 5a to 5b respectively depict schematic representations of an optical system 400 that fulfils certain criteria for one or more boundary conditions. FIG. 5a is a projection of the optical path of the optical system 400 in a first direction. FIG. 5b is a projection of the optical path of the optical system 400 in a second direction perpendicular to the first direction. Therefore, FIGS. 5a and 5b respectively represent orthogonal views of the optical system 400.

The optical system 400 comprises a first reflector system 410 and a second reflector system 412. Each of the first and second reflector systems 410, 412 comprises a finite-to-finite Wolter reflector system. The optical system 400 is configured to form, on the region of interest on a target T (see FIG. 4), a demagnified image 414 of an object 416 comprising an apparent source of the beam of radiation B. Each of the finite-to-finite Wolter reflector systems has a finite-to-finite conjugate distance relationship in which the image 414 is located a finite distance away from the object 416. The Wolter reflector system may fulfil certain criteria that other reflector configurations may not fulfil based on one or more boundary conditions. For example, the Wolter reflector system may satisfy the Abbe sine condition even if the apparent source, to a certain extent, is not an exact point and/or if at least a part of the apparent source is off-axis in order to provide imaging performance that fulfils the criteria.

The first and second reflector systems 410, 412 each comprise a one-dimensional finite-to-finite Wolter reflector system. As depicted by FIG. 5a, the first reflector system 410 is configured to demagnify the object 416 in a first direction 418 taken along an object plane 420 comprising the object 416 to form a corresponding demagnified image 414 of the object 416 in a corresponding first direction 418 taken along an image plane 422 comprising the image 414. As depicted by FIG. 5b, the second reflector system 412 is configured to demagnify the object 414 in a second direction 424 taken along the object plane 420, the second direction 424 being perpendicular to the first direction 418, to form a corresponding demagnified image 414 of the object 416 in a corresponding second direction 424 taken along the image plane 422. The one-dimensional Wolter reflector system may be manufactured within a desired tolerance level to provide imaging performance that fulfils the criteria. In contrast, a two-dimensional Wolter reflector system (i.e. having a doubly-curved reflector surface) may not provide an imaging performance that fulfils the criteria since the doubly-curved reflector surface may not be manufacturable and/or may have not an acceptable surface quality for providing imaging performance that fulfils the criteria.

The optical system 400 is configured such that a principal surface 426 of the first reflector system 410 and a principal surface 428 of the second reflector system 412 intersects an axis 430 defined between the object 416 and the image 424 at an intersection point 432 that is closer to the image 414 than the object 416. The position of each of the principal surfaces 426, 428 nearer to the image 414 than the object 416 results in the optical system 400 being in a demagnifying configuration. The Wolter reflector systems can be configured such that the principal surface 426 of the first reflector system 410 intersects the axis 430 at substantially the same intersection point 432 as the principal surface 428 of the second reflector system 412.

The demagnification factor in the first and second directions 418, 424 can be made substantially the same or the same by ensuring that the intersection point 432 is the same for both the first and second reflector systems 410, 412. Beneficially, providing the same demagnification factor in both the first and second directions 418, 424 may allow the optical system 400 to form an isomorphic image 414 of the object 416. Alternatively and if preferred, a different demagnification factor may be provided for the first and second directions 418, 424 to form an anamorphic image of the object (e.g. such that there is no longer a single intersection point 432 that comprises both the principal surfaces 426, 428).

The demagnification factor may be defined by a ratio between a dimension of the object 416 taken along the first or second direction 418, 424 and a corresponding dimension of the image 414 taken along the corresponding first or second direction 418, 424. For example, the demagnification factor may be defined by the ratio between an encircling radius ($r_o$) of the object 416 at $1/e^2$ (i.e. 13.5%) of the maximum intensity of the object 416 along the first direction 418 and an encircling radius ($r_i$) of the image 414 at $1/e^2$ (i.e. 13.5%) of the maximum intensity of the image 414 along the corresponding first direction 418. Thus, the demagnification factor in the first direction 418 equals $r_o/r_i$ ($r_o$ over $r_i$). A similar relationship applies to the demagnification factor in the second direction 424.

The orientation of the respective components of the optical system 400 is now described in more detail. The first reflector system 410 is oriented relative to the second reflector system 412 such that at least one plane of incidence intersecting the first reflector system 410 is perpendicular to at least one plane of incidence intersecting the second reflector system 412. The plane of incidence of a reflector comprises an incident and reflected chief ray of the beam of radiation B that is reflected by the reflector. As can be seen by comparing FIGS. 5a and 5b, the optical system 400 is configured such that a first plane of incidence intersects each reflector M1, M2 of the first reflector system 410. The first plane of incidence is parallel to the first direction 418 and the axis 430. In addition, a second plane of incidence intersects each reflector M3, M4 of the second reflector system 412. The second plane of incidence is parallel to the second direction 424 and the axis 430. Since the reflectors M1, M2 of the first reflector system 410 are oriented in a perpendicular relation to the reflectors M3, M4 of the second reflector system 412, it can be seen that the first and second planes of incidence are also perpendicular to each other.

The particular type of Wolter reflector system used in the optical system 400 is now described in more detail. The optical system 400 comprises a Wolter type III reflector system provided as the first reflector system 410 and a Wolter type I reflector system as the second (subsequent) reflector system 412. As noted previously, each of these Wolter reflector systems is configured in a finite-to-finite configuration. In addition, each of the reflectors is referred to as a one-dimensional reflector in that each reflector surface is curved in a single direction only (i.e., the reflectors do not comprise a doubly-curved reflector surface).

In its finite-to-finite configuration, a primary reflector of the Wolter type III reflector system comprises an elliptic-cylindrical convex reflector and a secondary reflector of the Wolter type III reflector system comprises an elliptic-cylindrical concave reflector. In its finite-to-finite configuration, a primary reflector of the Wolter type I reflector system comprises an elliptic-cylindrical concave reflector and a secondary reflector of the Wolter type I reflector system comprises a hyperbolic-cylindrical concave reflector.

Accordingly, the sequence of reflectors provided in the optical system 400 from the object 416 to the image 414 is as follows. A first reflector M1 (i.e. the primary reflector of the first reflector system 410) of the optical system 400 comprises an elliptic-cylindrical convex reflector. A second reflector M2 (i.e. the secondary reflector of the first reflector system 410) of the optical system 400 comprises an elliptic-cylindrical concave reflector. A third reflector M3 (i.e. the primary reflector of the second reflector system 412) of the optical system 400 comprises an elliptic-cylindrical convex reflector. A fourth reflector M4 (i.e. the secondary reflector of the second reflector system 412) of the optical system 400 comprises a hyperbolic-cylindrical concave reflector.

Optionally, the optical system 400 comprises a diffractive element (not shown) for diffracting at least a portion of the beam of radiation B to produce spatially separated spectral components of the beam of radiation B away from the optical path. In an example depicted by FIG. 5a, the diffractive element is provided as part of the second reflector M2 of the first reflector system 410. In other examples, a diffractive element and corresponding detector may be provided at another part of the optical system, for example, as part of one or more reflectors. The diffractive element may be a separate element provided on or as part of a reflector of the optical system 400. Alternatively, the diffractive element may be formed as part of the surface of the reflector. In this alternative configuration, the diffractive element is configured to specularly reflect a portion RP of the beam of radiation B for projection through the rest of the optical system 400. The diffractive element is further configured to diffract a remaining portion DP of the beam of radiation B towards a reference detector 314 (see FIG. 4) for analyzing the spectral content of the diffracted part of the beam of radiation B.

FIGS. 6a to 6b respectively depict schematic representations of an optical system 500 that fulfils certain criteria for one or more boundary conditions. FIG. 6a is a projection of the optical path of the optical system 500 in a first direction. FIG. 6b is a projection of the optical path of the optical system 500 in a second direction perpendicular to the first direction. Therefore, FIGS. 6a and 6b respectively represent orthogonal views of the optical system 500.

In common with the optical system 400, the optical system 500 comprises two Wolter reflector systems albeit with a different configuration as described in more detail below. Features of the optical system 500 that correspond to features of the optical system 400 are represented with reference numerals incremented by 100. The optical system 500 is therefore similar to the optical system 400 and may provide an imaging performance that fulfils certain criteria.

The optical system 500 comprises a first reflector system 510 and a second reflector system 512. Each of the first and second reflector systems 510, 512 comprises a one-dimensional finite-to-finite Wolter reflector system. However, in contrast to the optical system 400 of FIGS. 5a to 5b, the optical system 500 comprises two Wolter type ill reflector systems (i.e. a Wolter type III reflector system followed by an additional Wolter type III reflector system). Accordingly, the sequence of reflectors provided in the optical system 500 from the object 516 to the image 514 is as follows. A first reflector M1' (i.e. the primary reflector of the first reflector system 510) of the optical system 500 comprises an elliptic-cylindrical convex reflector. A second reflector M2' (i.e. the secondary reflector of the first reflector system 510) of the optical system 500 comprises an elliptic-cylindrical concave reflector. A third reflector M3' (i.e. the primary reflector of the second reflector system 512) of the optical system 500 comprises an elliptic-cylindrical convex reflector. A fourth reflector M4' (i.e. the secondary reflector of the second reflector system 512) of the optical system 500 comprises an elliptic-cylindrical concave reflector. Compared with the optical system 400 of FIGS. 5a to 5b, the fourth reflector M4' of the optical system 500 may be located further away from the region of interest since the second reflector system 512 comprises a Wolter type III reflector system instead of a Wolter type I reflector system. Thus, the configuration of the optical system 500 may provide a larger free working distance between the fourth reflector M4' and the region of interest compared with the optical system 400. Such a configuration may represent an easing of at least one boundary condition (e.g., free working distance) compared with the optical system 400. However, while at least one boundary condition may be eased, this particular configuration may affect at least one other boundary condition.

As depicted by FIG. 6a, the first reflector system 510 is configured to demagnify the object 516 in a first direction 518 taken along an object plane 520 comprising the object 516 to form a corresponding demagnified image 514 of the object 516 in a corresponding first direction 518 taken along an image plane 522 comprising the image 514. As depicted by FIG. 6b, the second reflector system 512 is configured to demagnify the object 514 in a second direction 524 taken along the object plane 520, the second direction 524 being perpendicular to the first direction 518, to form a corresponding demagnified image 514 of the object 516 in a corresponding second direction 524 taken along the image plane 522.

The optical system 500 may be configured such that a principal surface 526 of the first reflector system 510 and a principal surface 528 of the second reflector system 512 intersects an axis 530 defined between the object 516 and the image 524 at an intersection point 532 that is closer to the image 514 than the object 516. In this example, the Wolter reflector systems are configured such that the principal surface 526 of the first reflector system 510 intersects the axis 530 at substantially the same intersection point 532 as the principal surface 528 of the second reflector system 512.

Optionally, the optical system 500 comprises a diffractive element (not shown) for spatially separating diffracted spectral components of the beam of radiation B. In an example depicted by FIG. 6a, the diffractive element is provided as part of the second reflector M2' of the first reflector system 510.

FIGS. 7a to 7b respectively depict schematic representations of an optical system 600 that fulfils certain criteria for one or more boundary conditions. FIG. 7a is a projection of the optical path of the optical system 600 in a first direction. FIG. 7b is a projection of the optical path of the optical system 600 in a second direction perpendicular to the first direction. Therefore, FIGS. 7a and 7b respectively represent orthogonal views of the optical system 600.

In common with the optical systems 400 and 500, the optical system 600 comprises two Wolter reflector systems albeit with a different configuration as described in more detail below. Features of the optical system 600 that correspond to features of the optical system 500 are represented with reference numerals incremented by 100. The optical system 600 is similar to the optical system 500 and may provide an imaging performance that fulfils certain criteria.

The optical system 600 comprises a first reflector system 610 and a second reflector system 612. Each of the first and second reflector systems 610, 612 comprises a one-dimensional finite-to-finite Wolter reflector system. Similar to the optical system 500 of FIGS. 6a to 6b, the optical system 600 comprises two Wolter type III reflector systems. The optical system 600 may have similar technical benefits to those provided by the optical system 500. In contrast to the sequence of reflectors provided in the optical system 500, the reflectors of the two Wolter type III reflector systems of the optical system 600 are intertwined as described in the following sequence between the object 616 and the image 614.

A first reflector M1" (i.e. the primary reflector of the first reflector system 610) of the optical system 600 comprises an elliptic-cylindrical convex reflector. The first reflector M1" is followed by a second reflector M2" (i.e. the primary reflector of the second reflector system 612) of the optical system 600 that comprises an elliptic-cylindrical convex reflector. The second reflector M2" is followed by a third reflector M3" (i.e. the secondary reflector of the first reflector system 610) of the optical system 600 that comprises an elliptic-cylindrical concave reflector. The third reflector M3" is followed by a fourth reflector M4" (i.e. the secondary reflector of the second reflector system 612) of the optical system 600 that comprises an elliptic-cylindrical concave reflector.

As depicted by FIG. 7a, the first reflector system 610 is configured to demagnify the object 616 in a first direction 618 taken along an object plane 620 comprising the object 616 to form a corresponding demagnified image 614 of the object 616 in a corresponding first direction 618 taken along an image plane 622 comprising the image 614. As depicted by FIG. 7b, the second reflector system 612 is configured to demagnify the object 614 in a second direction 624 taken along the object plane 620, the second direction 624 being perpendicular to the first direction 618, to form a corresponding demagnified image 614 of the object 616 in a corresponding second direction 624 taken along the image plane 522.

With reference to FIGS. 7a and 7b, it can be seen that the optical system 600 is configured such that:
a first plane of incidence intersects the primary reflector M1" of the first reflector system 610,
a second plane of incidence intersects a primary reflector M2" of the second reflector system 612,
a third plane of incidence intersects a secondary reflector M3" of the first reflector system 610 and
a fourth plane of incidence intersects a secondary reflector M4" of the second reflector system 612.

The first and third planes of incidence are non-parallel to each other (see FIG. 7b). The second and fourth planes of incidence also non-parallel to each other (see FIG. 7a) but are perpendicular to the first and third planes of incidence (see both FIGS. 7a and 7b).

Although embodiments described herein identify certain boundary conditions defined with respect to the radiation beam at e.g., $1/e^2$ of the maximum intensity, the boundary conditions may alternatively or additionally be defined with respect to 0.5 of the maximum intensity (i.e., the full-width half-maximum or FWHM intensity) or 0.1, 0.01, 0.001, or 0.0001 of the maximum intensity. In certain embodiments, the optical system may be designed such that 99.99% of the energy of the beam of radiation may be within the imaged spot at the region of interest. However, the optical system may be designed such that greater than or equal to: 90%, 95%, 97.5%, 99%, 99.9% of the energy of the beam of radiation may be within the imaged spot at the region of interest.

Further embodiments are provided in the subsequent numbered clauses:

1. An optical system for focusing a beam of radiation on a region of interest of a substrate in a metrology apparatus, the beam of radiation comprising radiation in a soft X-ray or Extreme Ultraviolet spectral range, the optical system comprising:

a first reflector system and a second reflector system, each of the first and second reflector systems comprising a finite-to-finite Wolter reflector system, the optical system being configured to form, on the region of interest, a demagnified image of an object comprising an apparent source of the beam of radiation.

2. An optical system according to clause 1, wherein each finite-to-finite Wolter reflector system comprises a one-dimensional finite-to-finite Wolter reflector system configured to demagnify the object in one direction taken along an object plane comprising the object to form a corresponding demagnified image of the object in a corresponding direction taken along an image plane comprising the image.

3. An optical system according to clause 2, wherein the first reflector system is configured to demagnify the object in a first direction taken along the object plane to form a corresponding demagnified image of the object in a corresponding first direction taken along the image plane and the second reflector system is configured to demagnify the object in a second direction taken along the object plane, the second direction being perpendicular to the first direction, to form a corresponding demagnified image of the object in a corresponding second direction taken along the image plane.

4. An optical system according to any one of clauses 1 to 3, wherein the optical system is configured such that a free working distance defined between a component of the optical system and the region of interest is greater than or equal to 10 cm.

5. An optical system according to any one of clauses 1 to 4, wherein the optical system is configured such that a principal surface of the first and second reflector systems intersects an axis defined between the object and the image at an intersection point that is closer to the image than the object.

6. An optical system according to clause 5, wherein the principal surface of the first reflector system intersects the axis at substantially the same intersection point as the principal surface of the second reflector system.

7. An optical system according to any one of clauses 1 to 6, wherein the optical system is configured such that a demagnification factor of the first reflector system is substantially the same as the demagnification factor of the second reflector system, the demagnification factor being defined by a ratio between a dimension of the object and a corresponding dimension of the image.

8. An optical system according to any one of clauses 1 to 7, wherein the optical system is configured to image the object with a desired demagnification aspect ratio so as to form an isomorphic image or an anamorphic image of the object.

9. An optical system according to any one of clauses 1 to 8, wherein the optical system is configured to de-magnify at least one dimension of the object by a demagnification factor of greater than or equal to 5, optionally greater than or equal to 8, optionally greater than or equal to 10.

10. An optical system according to any one of clauses 1 to 9, wherein the first reflector system is oriented relative to the second reflector system such that at least one plane of incidence intersecting the first reflector system is perpendicular to at least one plane of incidence intersecting the second reflector system.

11. An optical system according to clause 10, wherein the optical system is configured such that a first plane of incidence intersects each reflector of the first reflector system and a second plane of incidence intersects each reflector of the second reflector system, the first and second planes of incidence being perpendicular to each other.

12. An optical system according to clause 10, wherein the optical system is configured such that a first plane of incidence intersects a primary reflector of the first reflector system, a second plane of incidence intersects a primary reflector of the second reflector system, a third plane of incidence intersects a secondary reflector of the first reflector system and a fourth plane of incidence intersects a secondary reflector of the second reflector system, the first and third planes of incidence being non-parallel to each other, the second and fourth planes of incidence being non-parallel to each other and perpendicular to the first and third planes of incidence.

13. An optical system according to any one of clauses 1 to 12, wherein the optical system is configured to focus the beam of radiation on the region of interest of a substrate so that information regarding the region of interest is determinable from radiation that is at least one of: reflected, scattered and diffracted from the region of interest, and optionally wherein the substrate comprises an integrated circuit or is usable in the manufacture of an integrated circuit.

14. An optical system according to any one of clauses 1 to 13, wherein the optical system comprises a Wolter type III reflector system and one of: an additional Wolter type III reflector system and a Wolter type I reflector system.

15. An optical system according to clause 14, wherein a primary reflector of the Wolter type III reflector system comprises an elliptic-cylindrical convex reflector and a secondary reflector of the Wolter type III reflector system comprises an elliptic-cylindrical concave reflector.

16. An optical system according to clause 14, wherein a primary reflector of the Wolter type I reflector system comprises an elliptic-cylindrical concave reflector and a secondary reflector of the Wolter type I reflector system comprises a hyperbolic-cylindrical concave reflector.

17. An optical system according to clause 14 or 15, wherein the first reflector system comprises the Wolter type III reflector system.

18. An optical system according to clause 14, 15 or 17, wherein the second reflector system comprises the additional Wolter type III reflector system.

19. An optical system according to clause 18, wherein the optical system comprises, in sequence between the object and the image, the Wolter type III reflector system, followed by the additional Wolter type III reflector system.

20. An optical system according to clause 18, wherein the optical system comprises, in sequence between the object and the image, a primary reflector of the Wolter type III reflector system, followed by a primary reflector of the additional Wolter type III reflector system, followed by a secondary reflector of the Wolter type III reflector system, followed by a secondary reflector of the additional Wolter type III reflector system.

21. An optical system according to any one of clauses 14 to 17, wherein the second reflector system comprises the Wolter type I reflector system, the optical system comprising, in sequence between the object and the image, the Wolter type III reflector system, followed by the Wolter type I reflector system.

22. An optical system according to any one of clauses 1 to 21, wherein at least one of the first reflector system and the second reflector system comprises a diffractive element for spatially separating diffracted spectral components of the beam of radiation.

23. An optical system according to clause 22, wherein the diffractive element is provided as part of a secondary reflector of the first reflector system.

24. An optical system according to any one of clauses 1 to 23, wherein the optical system is configured such that a pathlength of a chief ray defined between the object and the image is less than or equal to 3 meters, optionally less than or equal to 1.5 meters.

25. A metrology or inspection apparatus, comprising:
   a substrate table for receiving and holding a substrate at a controllable position;
   a radiation source for generating a beam of illumination radiation; and
   an optical system according to any one of clauses 1 to 24 for focusing the beam of illumination radiation at a region of interest on the substrate.

26. A metrology apparatus for determining a characteristic of interest of a portion of structure manufactured on a substrate, the metrology apparatus comprising the optical system according to any one of the clauses 1 to 24.

27. An inspection apparatus for inspecting a portion of a structure manufactured on a substrate, the inspection apparatus comprising the optical system according to any one of the clauses 1 to 24.

28. A litho cell comprising the metrology or inspection apparatus according to clause 25, the metrology apparatus according to clause 26 or the inspection apparatus according to clause 27.

29. A method of using an optical system for focusing a beam of radiation on a region of interest of a substrate in a metrology apparatus, the beam of radiation comprising radiation in a soft X-ray or Extreme Ultraviolet spectral range, the method comprising:
   providing an optical system comprising a first reflector system and a second reflector system, each of the first and second reflector systems comprising a finite-to-finite Wolter reflector system; and
   forming, on the region of interest, a demagnified image of an object comprising an apparent source of the beam of radiation.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference is made to "metrology apparatus/tool/system" or "inspection apparatus/tool/system", these terms may refer to the same or similar types of tools, apparatuses or systems. E.g. the inspection or metrology apparatus that comprises an embodiment of the invention may be used to determine characteristics of structures on a substrate or on a wafer. E.g. the inspection apparatus or metrology apparatus that comprises an embodiment of the invention may be used to detect defects of a substrate or defects of structures on a substrate or on a wafer. In such an embodiment, a characteristic of interest of the structure on the substrate may relate to defects in the structure, the absence of a specific part of the structure, or the presence of an unwanted structure on the substrate or on the wafer.

Although specific reference may have been made above to the use of embodiments of the invention in the context of optical lithography, it will be appreciated that the invention, where the context allows, is not limited to optical lithography and may be used in other applications, for example imprint lithography.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. An optical system for focusing a beam of radiation on a region of interest of a substrate in a metrology apparatus, the beam of radiation comprising radiation in a soft X-ray or Extreme Ultraviolet spectral range, the optical system comprising:
   a first reflector system and a second reflector system, each of the first and second reflector systems comprising a finite-to-finite Wolter reflector system, wherein
   the optical system is configured to form, on the region of interest, a demagnified image of an object comprising an apparent source of the beam of radiation.

2. The optical system of claim 1, wherein the first reflector system is configured to demagnify the object in a first direction taken along an object plane to form a corresponding demagnified image of the object in a corresponding first direction taken along an image plane and the second reflector system is configured to demagnify the object in a second direction taken along the object plane, the second direction being perpendicular to the first direction, to form a corresponding demagnified image of the object in a corresponding second direction taken along the image plane.

3. The optical system of claim 1, wherein the optical system is configured such that a free working distance defined between a component of the optical system and the region of interest is greater than or equal to 10 cm.

4. The optical system of claim 1, wherein the optical system is configured such that a principal surface of the first and second reflector systems intersects an axis defined between the object and the image at an intersection point that is closer to the image than the object.

5. The optical system of claim 4, wherein, the principal surface of the first reflector system intersects the axis at substantially the same intersection point as the principal surface of the second reflector system.

6. The optical system of claim 1, wherein the optical system is configured such that a demagnification factor of the first reflector system is substantially the same as the demagnification factor of the second reflector system, the demagnification factor being defined by a ratio between a dimension of the object and a corresponding dimension of the image.

7. The optical system of claim 1, wherein the optical system is configured to image the object with a desired demagnification aspect ratio so as to form an isomorphic image or an anamorphic image of the object.

8. The optical system of claim 1, wherein the optical system is configured to demagnify at least one dimension of the object by a demagnification factor of greater than or equal to 5, greater than or equal to 8, or greater than or equal to 10.

9. The optical system of claim 1, wherein:
the first reflector system is oriented relative to the second reflector system such that at least one plane of incidence intersecting the first reflector system is perpendicular to at least one plane of incidence intersecting the second reflector system; and
one of:
the optical system is configured such that a first plane of incidence intersects each reflector of the first reflector system and a second plane of incidence intersects each reflector of the second reflector system, the first and second planes of incidence being perpendicular to each other,
the optical system is configured such that a first plane of incidence intersects a primary reflector of the first reflector system, a second plane of incidence intersects a primary reflector of the second reflector system, a third plane of incidence intersects a secondary reflector of the first reflector system and a fourth plane of incidence intersects a secondary reflector of the second reflector system, the first and third planes of incidence being non-parallel to each other, the second and fourth planes of incidence being non-parallel to each other and perpendicular to the first and third planes of incidence.

10. The optical system of claim 1, wherein the Wolter reflector systems comprise a Wolter type III reflector system and an additional Wolter type III reflector system or a Wolter type I reflector system.

11. The optical system of claim 10 wherein:
a primary reflector of the Wolter type III reflector system comprises an elliptic-cylindrical convex reflector and a secondary reflector of the Wolter type III reflector system comprises an elliptic-cylindrical concave reflector, or
a primary reflector of the Wolter type I reflector system comprises an elliptic-cylindrical concave reflector and a secondary reflector of the Wolter type I reflector system comprises a hyperbolic-cylindrical concave reflector.

12. The optical system of claim 10, wherein the first reflector system comprises the Wolter type III reflector system.

13. The optical system of claim 10, wherein the second reflector system comprises the additional Wolter type III reflector system.

14. The optical system of claim 13, wherein the optical system comprises, in sequence between the object and the image:
the Wolter type III reflector system, followed by the additional Wolter type III reflector system, or
a primary reflector of the Wolter type III reflector system, followed by a primary reflector of the additional Wolter type III reflector system, followed by a secondary reflector of the Wolter type III reflector system, followed by a secondary reflector of the additional Wolter type III reflector system.

15. The optical system of claim 1, wherein:
at least one of the first reflector system and the second reflector system comprises a diffractive element for spatially separating diffracted spectral components of the beam of radiation; and
the diffractive element is provided as part of a secondary reflector of the first reflector system.

16. The optical system of claim 15, wherein the diffractive element is configured to diffract a first portion of the beam of radiation towards a reference detector and to reflect a second portion of the beam of radiation towards a reflector of the second reflector system.

17. The optical system of claim 1, wherein the optical system is configured such that a pathlength of a chief ray defined between the object and the image is less than or equal to 3 meters, optionally less than or equal to 1.5 meters.

18. A metrology apparatus for determining a characteristic of interest of a portion of a structure manufactured on a substrate, the metrology apparatus comprising:
an optical system for focusing a beam of radiation on a region of interest of a substrate in a metrology apparatus, the beam of radiation comprising radiation in a soft X-ray or Extreme Ultraviolet spectral range, the optical system comprising:
a first reflector system and a second reflector system, each of the first and second reflector systems comprising a finite-to-finite Wolter reflector system,
wherein the optical system is configured to form, on the region of interest, a demagnified image of an object comprising an apparent source of the beam of radiation;
wherein at least one of the first reflector system and the second reflector system comprises a diffractive element for spatially separating diffracted spectral components of the beam of radiation;
wherein the diffractive element is provided as part of a secondary reflector of the first reflector system.

19. A litho cell comprising the metrology apparatus of claim 18.

20. A method of using an optical system for focusing a beam of radiation on a region of interest of a substrate in a metrology apparatus, the beam of radiation comprising radiation in a soft X-ray or Extreme Ultraviolet spectral range, the method comprising:
providing an optical system comprising a first reflector system and a second reflector system, each of the first and second reflector systems comprising a finite-to-finite Wolter reflector system; and
forming, on the region of interest, a demagnified image of an object comprising an apparent source of the beam of radiation.

* * * * *